US006235638B1

(12) United States Patent
Huang et al.

(10) Patent No.: US 6,235,638 B1
(45) Date of Patent: May 22, 2001

(54) SIMPLIFIED ETCHING TECHNIQUE FOR PRODUCING MULTIPLE UNDERCUT PROFILES

(75) Inventors: Karen Huang; Christophe Pierrat, both of Hsin-Chu (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/249,787

(22) Filed: Feb. 16, 1999

(51) Int. Cl.[7] .................................................. H01L 21/302

(52) U.S. Cl. .......................... 438/695; 438/696; 438/704; 438/750; 438/756; 216/2; 216/11; 216/24; 216/46; 216/57; 216/67; 216/72; 216/83; 216/95; 216/99

(58) Field of Search .................................... 438/695, 696, 438/704, 733, 739, 750, 756; 216/2, 11, 24, 41, 46, 57, 67, 72, 83, 87, 95, 99

(56) References Cited

U.S. PATENT DOCUMENTS 5,258,264 * 11/1993 Mathad et al. ......................... 216/40
5,308,415 * 5/1994 Chou ..................................... 156/643
5,358,893 * 10/1994 Yang et al. ............................ 437/70
5,571,376 * 11/1996 Bestwick et al. ................. 156/647.1
5,940,731 * 8/1999 Wu ....................................... 438/640
6,046,100 * 4/2000 Ramaswami et al. ............... 438/624
6,093,330 * 7/2000 Chong et al. ............................ 216/2

FOREIGN PATENT DOCUMENTS 60-154622 * 8/1985 (JP) ........................................ 216/67
61-156739 * 7/1986 (JP) ........................................ 216/67

* cited by examiner

*Primary Examiner*—Anita Alanko
(74) *Attorney, Agent, or Firm*—Nixon & Vanderhye P.C.

(57) ABSTRACT

A process for producing multiple undercut profiles in a single material. A resist pattern is applied over a work piece and a wet etch is performed to produce an undercut in the material. This first wet etch is followed by a polymerizing dry etch which produces a polymer film in the undercut created by the first wet etch. The polymer film prevents further etching of the undercut portion during a second wet etch. Thus, an undercut profile can be obtained having a larger undercut in an underlying portion of the work piece, utilizing only a single resist application step. The work piece may be a multi-layer work piece having different layers formed of the same material, or it may be a single layer of material.

15 Claims, 11 Drawing Sheets

SIMPLIFIED ETCHING TECHNIQUE FOR PRODUCING MULTIPLE UNDERCUT PROFILES

STATEMENT OF GOVERNMENT INTEREST

This invention was made with United States Government support under Contracts No. DABT63-93-C-0025 and MDA972-92C-0054 awarded by the Advanced Research Projects Agency (ARPA). The United States Government has certain rights in this invention.

BACKGROUND OF THE INVENTION

The present invention relates to a semiconductor manufacturing technique that reduces the cost and complexity of producing multiple undercut profiles in the same material. For example, the present invention provides a simplified etch process capable of generating two different undercut profiles in the same material, such as silicon dioxide or the like, using a single lithographic step during the manufacture of flat panel field emission display (FED) devices.

Conventional semiconductor techniques commonly utilize lithographic techniques to selectively place a pattern on a work piece during manufacture. For example, lithography may be used to apply a resist pattern over a layer of material such as silicon dioxide. An etching process then removes portions of the silicon dioxide that remain exposed after the photoresist pattern is printed over the silicon dioxide layer. Such an etching process allows a manufacturer to obtain a desired structure in the underlying material. The photoresist pattern is typically removed after etching and the work piece may be processed further by the deposition of additional material layers and further selective etchings. Mechanical operations such as chemicalmechanical planarization (CMP) and other processes may also be used in the manufacturing process.

One difficulty that has been encountered in prior manufacturing techniques is based on the requirement that the various layers of the semiconductor device be aligned with a relatively high degree of alignment accuracy. Unfortunately, lithographic printing techniques may be somewhat limited in alignment accuracy and resolution. For example, one resist pattern may be slightly offset relative to the underlying work piece. If a subsequent resist layer is also offset, possibly in a direction different from the first offset direction, then a defect may result, lowering the effective yield of the manufacturing process. Similarly, the resolution of the printing process might not allow for fine detail that would permit certain structures to be obtained. Thus, it may be necessary to introduce a relatively large "margin of error" into the manufacturing process by producing features that are large enough to accommodate misalignments. Of course, this limits the degree of miniaturization that may be achieved in the manufacturing operation.

Each photolithographic/etching step entails the expenditure of time and resources, adding to the costs of manufacture. Moreover, each photolithographic/etching step carries with it the possibility of errors or defects and, consequently, potentially reduced yields. Thus, from the standpoint of size, cost and yield, it is desirable to minimize the number of photolithographic steps performed during the manufacturing operation.

It is a primary objective of the present invention to provide a simplified etch process that avoids difficulties encountered in prior art manufacturing techniques, and is capable of producing two different undercut profiles in a work piece using a single lithographic step. The present invention may find application, for example, in the manufacture of flat panel field emission displays (FEDs). However, the invention is not limited to FEDs and may be used in connection with manufacturing processes for other devices such as micromachines that may require undercut structures within a base material.

BRIEF SUMMARY

In accordance with one aspect of the present invention, a method for producing an undercut profile in a work piece includes forming a resist pattern on a top surface of the work piece. Apertures in the resist pattern expose portions of the work piece where an undercut profile is to be created. A first etch is performed on the portions of the work piece exposed by said resist pattern to remove material from the work piece and to create a selected undercut in the work piece. A second etch is then performed on the work piece to remove additional material from the work piece and to produce a polymer film which at least partially fills the selected undercut created by the first etch. A third etch removes yet more material from the work piece and creates an additional selected undercut in the work piece. Finally, the resist pattern is stripped and the polymer film is removed.

The first etch and the third etch may each be a wet etch process, and the second etch may be a polymerizing dry etch process. The work piece may be a single layer of material or may include a plurality of material layers wherein at least two of the material layers are formed of the same material.

In accordance with another aspect of the present invention, a simplified etch process capable of generating selected undercut profiles in a work piece performs a first wet etch of portions of the work piece to create a first undercut in the work piece. A polymer film is then formed over side surfaces of the first undercut to inhibit further etching of the first undercut during subsequent etching operations. Then, a second wet etch of portions of the work piece is performed to create a second undercut in the work piece. In a preferred implementation the polymer film is formed by a polymerizing dry etch. The etching steps may be controlled by a resist pattern formed on the work piece prior to etching. The resist pattern and the polymer film are then removed following the final etching step.

In accordance with yet another aspect of the present invention, a method used in the manufacture of a flat panel field emission display forms a resist pattern over a field emission display base structure which includes a plurality of material layers arranged on a substrate, with at least a first material layer and a second material layer being formed of the same material. The resist pattern has a plurality of apertures that define portions of the base structure that are to be etched. The first material layer is etched at the defined portions with an etching process that creates an undercut in the first material layer. The defined portions of the base structure are etched with a polymerizing etch process to form a polymer film at the undercut made in the first material layer. The second material layer is then etched at the defined portions with an etching process that creates an undercut in the second material layer. After the second material layer is etched, the polymer film and the resist pattern are removed.

In one implementation, the first material layer and the second material layer are insulation layers formed of silicon dioxide. In that case, the steps of etching the first and second material layers are each wet etch processes utilizing hydrogen fluoride. Moreover, the base structure may include a top passivation layer of silicon nitride. In that case, a dry etch of the silicon nitride layer is performed at the portions of the base structure defined by the apertures in the resist pattern prior to etching the first layer.

In accordance with yet another aspect of the present invention, a non-horizontal surface of a first material is defined within a semiconductor device. The semiconductor device is exposed to a first material-etching substance and the non-horizontal surface is protected from the material-etching substance. For example, the non-horizontal surface may be protected by forming a polymer on the surface.

A further aspect of the invention provides a method for profiling a semiconductor device by providing a patterned mask over the semiconductor material, performing a first etch of the material while guiding the first etch with the mask, adding a polymer to an etched portion of the material, and performing a second etch of the material while guiding the second etch with the mask and the polymer. Additionally, in one aspect of the present invention, a method is provided for producing multiple undercut profiles within a semiconductor device. A plurality of levels is defined within the semiconductor device using a plurality of etches. A polymer is generated on a side of at least one of the levels after at least one etch of the plurality of etches, and at least one etch of said plurality of etches is performed after the polymer is generated. As an example, the plurality of layers in the semiconductor device may be a plurality of layers within an insulator.

These and other aspects of the present invention are set forth in greater detail below and in the appended claims. It should be noted that the foregoing description of the various aspects of the invention is not exhaustive and should not be considered to limit the present invention. Instead, the invention is intended to cover various modifications and equivalent arrangements included within the scope of the claims.

BRIEF DESCRIPTION OF THE DRAWINGS

The objects, features, advantages and characteristics of the present invention will become apparent from the following detailed description of the preferred embodiment, when read in view of the accompanying drawings, wherein:

FIG. 1(*b*) is a cross-sectional schematic drawing illustrating the work piece of FIG. 1(*a*) following a dry etch process;

FIG. 2(*b*) is a cross-sectional view of the work piece illustrated in FIG. 2(*a*) following a wet etch process in accordance with one aspect of the present invention;

FIG. 2(*c*) is a cross-sectional view of the work piece illustrated in FIG. 2(*b*) following a polymerizing dry etch process;

FIG. 2(*d*) is a cross-sectional view of the work piece illustrated in FIG. 2(*c*) following a further wet etch process;

FIG. 2(*e*) is a cross-sectional view of the resultant work piece of FIG. 2(*d*) following stripping of the resist material and cleaning;

FIG. 4(*b*) is a cross-sectional schematic drawing of the work piece portion of FIG. 4(*a*) following a dry etch process;

FIG. 4(*c*) is a cross-sectional schematic drawing of the work piece portion of FIG. 4(*b*) following a wet etch process;

FIG. 4(*d*) is a cross-sectional schematic drawing of the work piece portion of FIG. 4(*c*) following a polymerizing dry etch process;

FIG. 4(*e*) is a cross-sectional schematic drawing of the work piece portion of FIG. 4(*d*) following a further wet etch process;

FIG. 4(*f*) is a cross-sectional schematic drawing illustrating the work piece portion of FIG. 4(*e*) after removal of the polymer deposited by the polymerizing dry etch;

FIG. 5(*b*) is a cross-sectional schematic drawing of the work piece of FIG. 5(*a*) following a first wet etch process;

FIG. 5(*c*) is a cross-sectional schematic drawing of the work piece of FIG. 5(*b*) following a polymerizing dry etch process;

FIG. 5(*d*) is a cross-sectional schematic drawing of the work piece of FIG. 5(*c*) following a second wet etch process;

FIG. 5(*e*) is a cross-sectional schematic drawing of the work piece of FIG. 5(*d*) following stripping of the resist material and removal of the polymer film produced by the polymerizing dry etch process;

DETAILED DESCRIPTION OF EXEMPLARY EMBODIMENTS

The present invention is described in the context of exemplary embodiments. However, the scope of the invention is not limited to the particular embodiments described in the application. Rather, the description merely reflects what are currently considered to be the most practical and preferred embodiments, and serves to illustrate the principles and characteristics of the present invention. Those skilled in the art will recognize that various modifications and refinements may be made without departing from the spirit and scope of the invention.

It is known that certain dry etch processes produce a carbonaceous polymer film on the work piece being etched. Such a polymer film can reduce the effectiveness of further etching and is ordinarily viewed as a problem or nuisance that should be minimized or removed during the etching process. See, e.g., S. Wolf and R. N Tauber, Silicon Processing for the VLSI Era, Vol. 1—Process Technology, Lattice Press, 1986, pp. 547–555. However, in accordance with one aspect of the present invention, a carbonaceous polymer film is purposely produced and allowed to remain on the work piece during further etching processes. The polymer film is then utilized in a way that permits a simplified etch process to produce a structure having multiple undercut profiles.

Figure 1A:
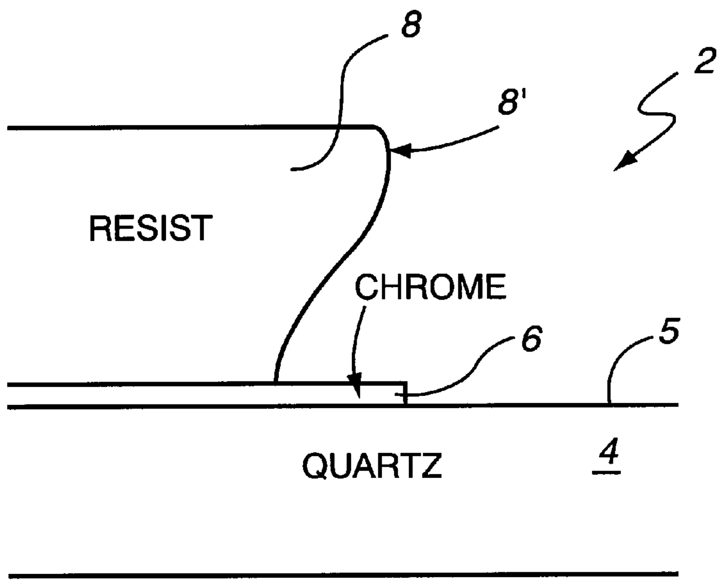
FIG. 1(*a*) is a cross-sectional schematic drawing illustrating a work piece having a quantity substrate with a conductive layer and a resist pattern formed thereon.
Figure 1B:
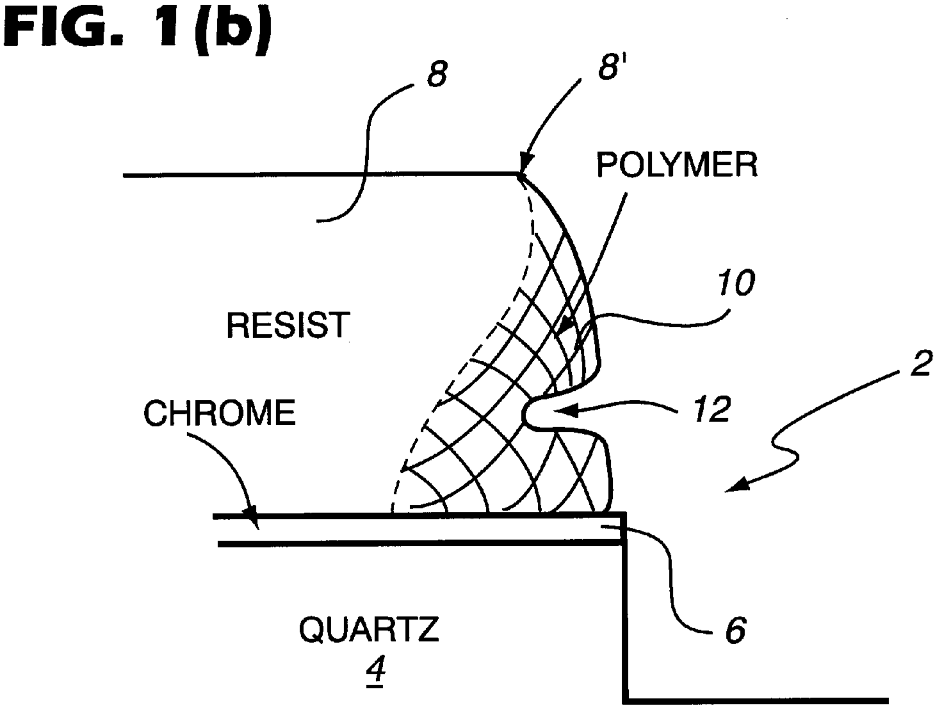
Figure 2A:
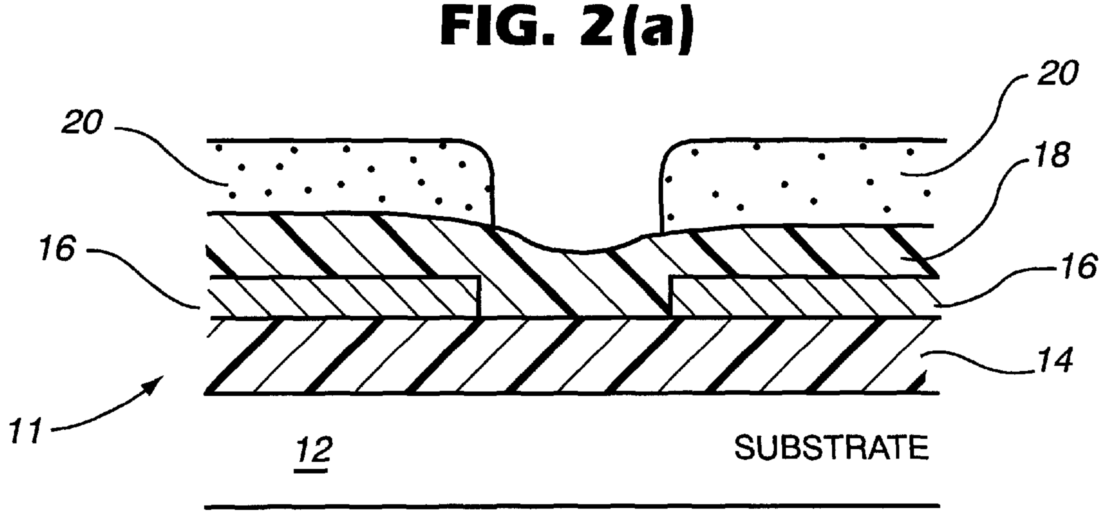
FIG. 2(*a*) is a cross-sectional schematic drawing illustrating a work piece after initial manufacturing steps.
Figure 2B:
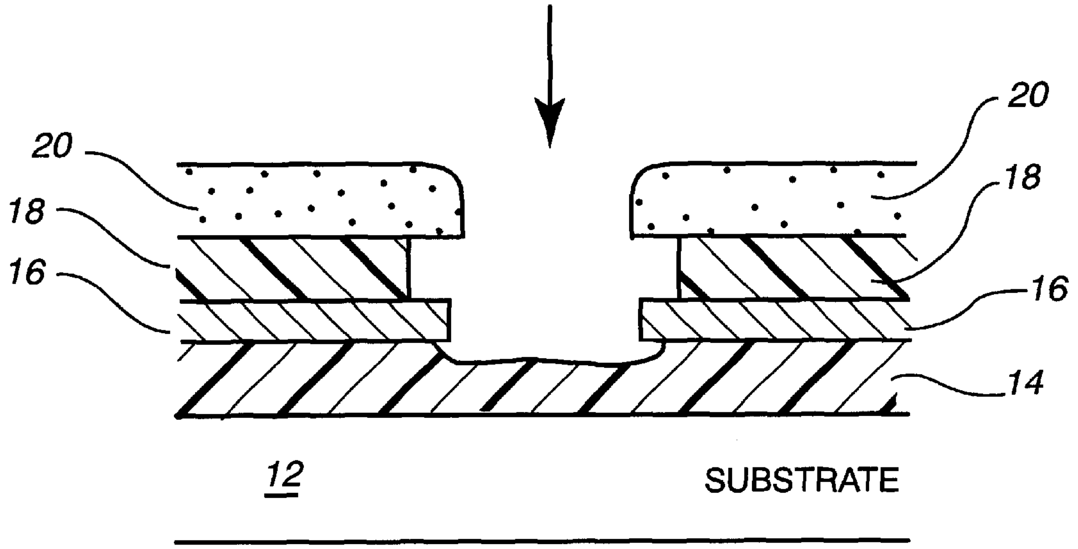
Figure 2C:
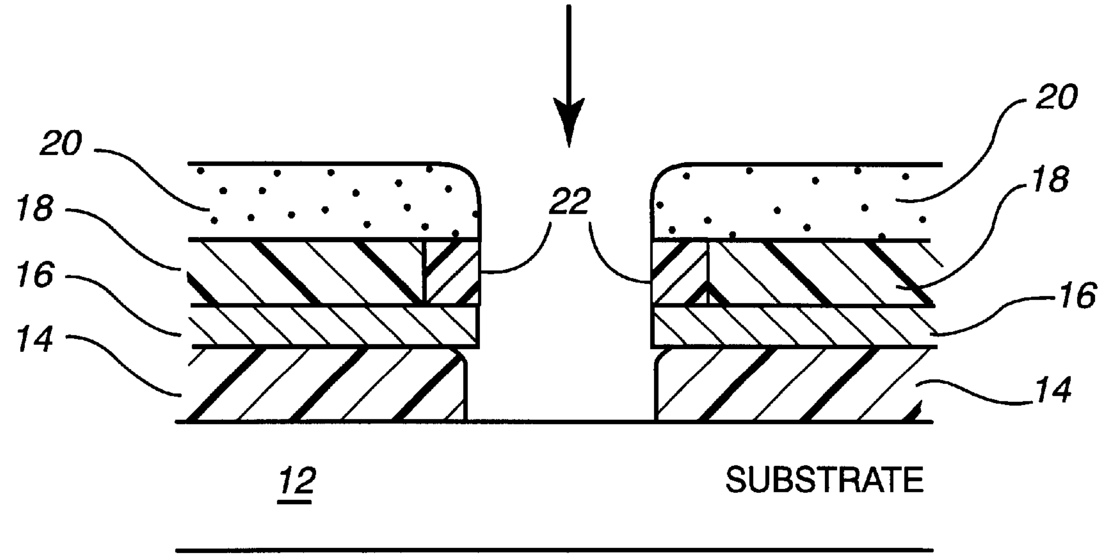
Figure 2D:
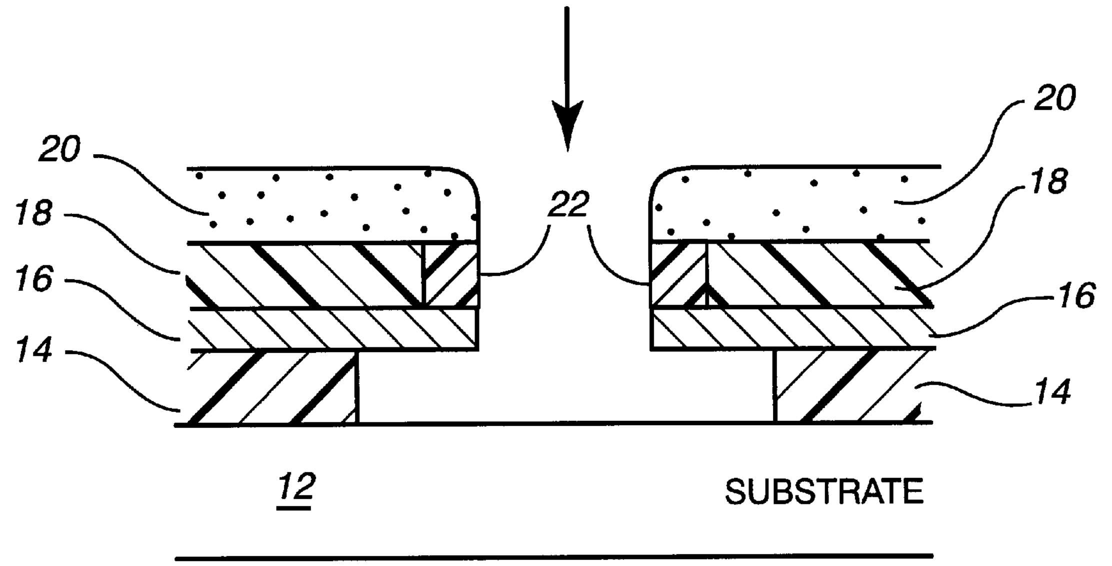
Figure 2E:
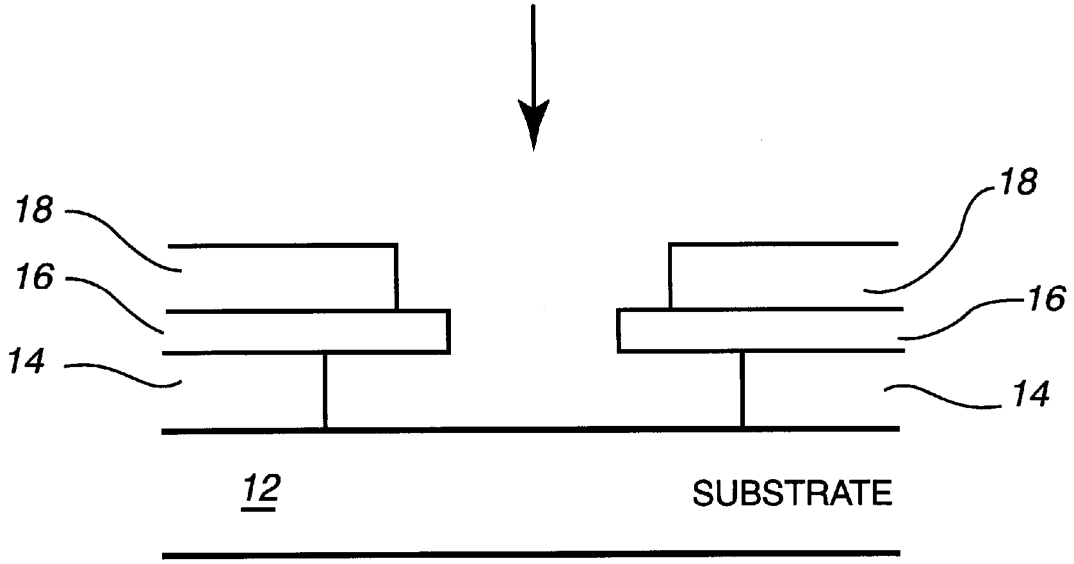

The formation of a carbonaceous polymer film on a work piece is described briefly in connection with FIGS. 1(*a*) and 1(*b*). It should be appreciated that this description is merely for the background purpose of illustrating the formation of a polymer film during etching. Workers in the field will recognize various alternative arrangements to which the principles of the present invention may be applied. Referring now to FIG. 1(*a*), a work piece 2 includes a quartz substrate material 4 having a horizontal surface 5 on which a conductive layer 6, such as chrome, is arranged. A resist pattern 8 is printed with a lithographic technique or otherwise formed on the work piece to act as an etch-guiding layer during subsequent etching. Other techniques for applying the resist pattern are known in the art and would include, for example, coating the work piece 2 with a photoresist material, exposing the photoresist to a light pattern to cure the photoresist, and removing the uncured portions of the photoresist.

FIG. 1(*b*) illustrates the work piece 2 following a polymerizing dry etch process of the quartz substrate 4. As shown in FIG. 1 (*b*), the dry etch process has removed a portion of the quartz substrate 4 that was left uncovered by an opening in the overlying resist pattern. During the dry etch process, a polymer film 10 is formed on the generally vertical face of the resist, and may include a pocket or void 12. As understood in the art, such polymer films tend to develop on vertical surfaces of the work piece, including the material being etched, and obstruct etching of the covered material unless the film is removed. The tendency of polymer films to develop is higher in areas that are set back from an overlapping portion such as the portion 8'.

In accordance with one aspect of the present invention, a polymer film may be utilized to selectively shield materials from further etching and thereby allow selected degrees of undercut structures to be produced in the end product. In other words, the polymer may be purposely used as an etch-guiding liner to protect a non-horizontal surface from further etching. A non-limiting exemplary process in accordance with this aspect of the invention is described in connection with FIGS. 2(*a*) through 2(*e*).

FIG. 2(*a*) illustrates an exemplary work piece 11 having a base substrate 12 formed, for example, of silicon or soda lime glass. A material layer 14 of, for example, silicon dioxide ($SiO_2$) is formed on top of the substrate 12, and subsequent material layers 16 and 18 are formed over the material layer 14. In this example embodiment, the material layer 16 may be a patterned conductive material layer such a doped polycrystalline silicon and/or an appropriate conductive metal such as chromium. The material layer 18 is formed of the same material as layer 14, silicon dioxide in this example. A patterned resist material is applied to the top surface of the silicon dioxide material layer 18 using conventional techniques.

It should be noted that various available techniques for forming a work piece structure such as is illustrated in FIG. 2(*a*) are well known in the art. Accordingly, the specific processes that may be used in forming such a work piece need not be described here.

With reference to FIG. 2(*b*), a wet etch process utilizing, for example, a hydrofluoric acid or hydrogen fluoride (HF) ambient may be used to etch the silicon dioxide material layer 18 at the location exposed by the resist pattern 20. As shown, the HF wet etch creates an undercut in the silicon dioxide layer 18 beneath the resist 20. Thus, the resist 20 acts as a mask having openings through which the etchant creates a first perimeter in the underlying material. The etch time and operating parameters depend upon the desired degree of undercut, the etchant being used, the material being etched, and other factors, as is well understood in the art. A detailed discussion of the specific parameters of a wet etch process that may be utilized in connection with FIG. 2(*b*) is therefore not provided herein.

Following the wet etch operation, a polymerizing dry etch process is applied to the silicon dioxide material layer 14. A number of well-known polymerizing dry etch processes using various ambients and operating parameters are available. The particular dry etch technique utilized will depend on the particular application, and an appropriate technique may be readily selected and applied by workers ordinarily skilled in etching. However, in the disclosed exemplary embodiment, a dry etch which produces little undercut in the etched material is used. Depending on the particular application, it may also be possible to utilize a dry etch process that does create a degree of undercut in the etched material.

As shown in FIG. 2(*c*), the dry etch process fills the undercut portion of the silicon dioxide material layer 18 with a polymer film "plug" 22 which lines the exposed vertical surface of layer 18. Compared to a wet etch, the dry etch used in this example has a reduced likelihood of producing a significant undercut in the etched material. Thus, although a slight undercut of silicon dioxide layer 14 is shown in FIG. 2(*c*), the etched portion substantially underlies the area exposed by the resist pattern 20. It should be noted that FIG. 2(*c*) shows the silicon dioxide material 14 completely etched through. However, particularly because the work piece will be exposed to further wet etching, it is not necessary for the silicon dioxide layer 14 to be completely etched at this time.

After the dry etch, the work piece is again subjected to a wet etch process to establish an undercut in the silicon dioxide layer 14, as illustrated in FIG. 2(*d*). Again, the degree of undercut is determined by the etching time and operating parameters employed in the wet etch. Undesired further etching of the silicon dioxide layer 18 is prevented by the presence of the polymer films 22. Thus, the material layer 14 may have a larger undercut than the overlying material layer 18. As a result, a second perimeter is etched in the semiconductor material while the first perimeter is generally retained by virtue of the protective polymer lining 22. Finally, the resist 20 is stripped from the work piece and the polymer film 22 is removed. The resulting structure is illustrated in FIG. 2(*e*).

The foregoing technique for producing multiple undercut profiles requires only a single lithographic step. This provides significant benefits over prior techniques that would require multiple lithographic steps, and may find application in many technical areas. One such area is the manufacture of flat panel field emission displays (FEDs), as described below. However, it should be understood that the broadest aspects of the present invention are not limited to the manufacture of FEDs.

Figure 3:
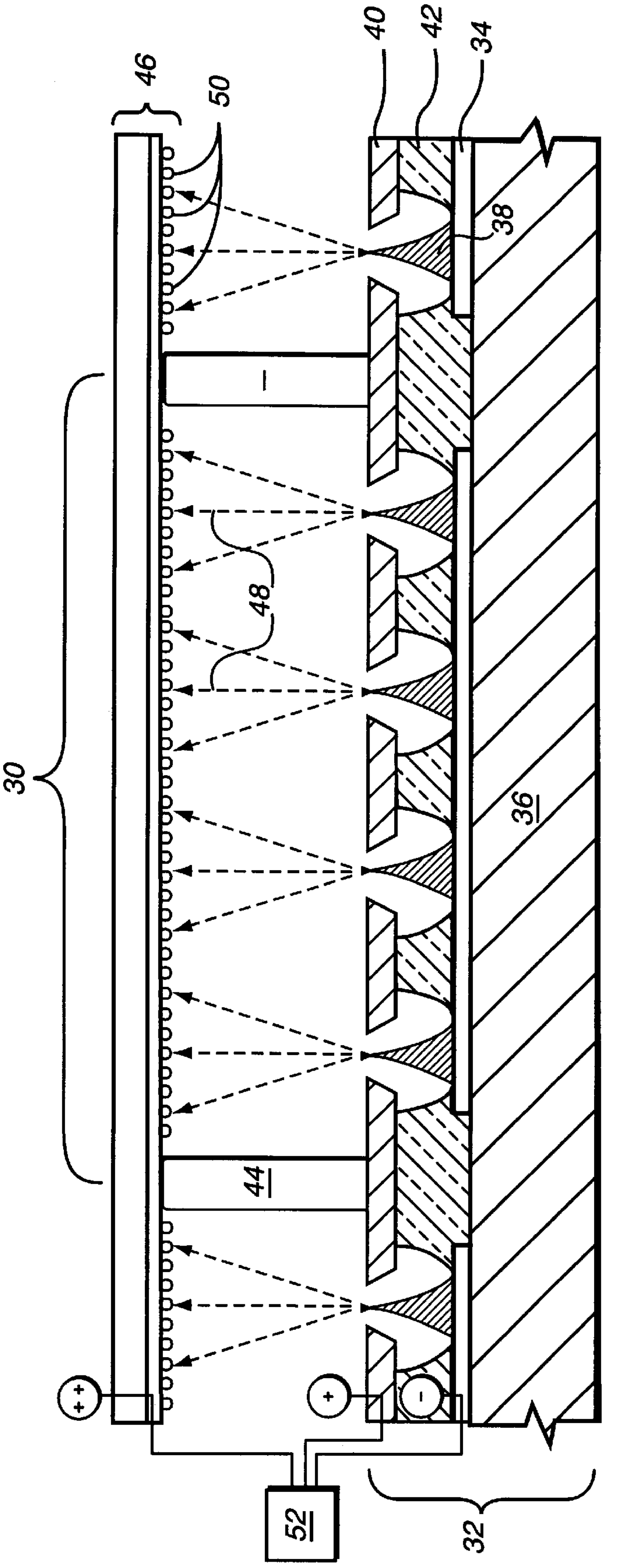
FIG. 3 (Prior Art)
FIG. 3 is an illustrative cross-sectional schematic drawing of a flat panel field emission display (FED) which may be constructed utilizing the features of the present invention.
Figure 4A:
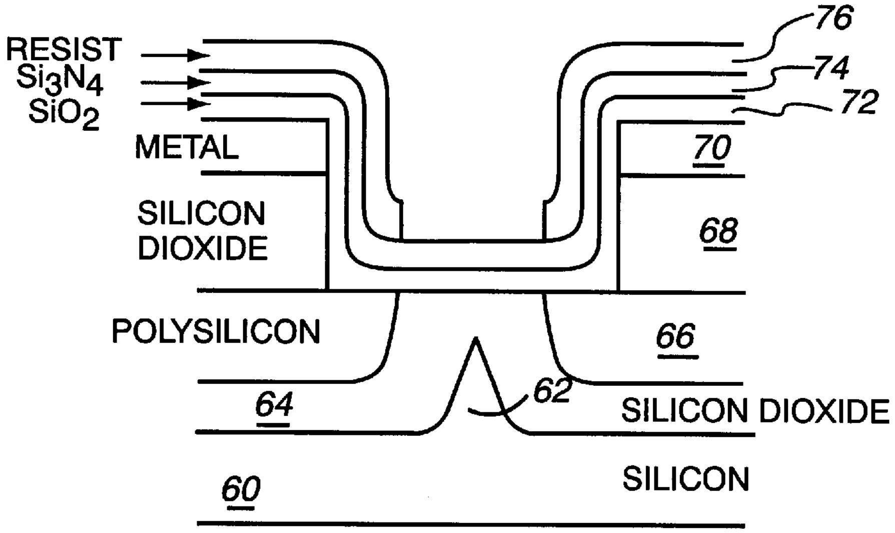
FIG. 4(*a*) is a cross-sectional schematic drawing of a portion of a work piece that may be processed in accordance with the features of the present invention to produce a field emission display such as is illustrated in FIG. 3.
Figure 4B:
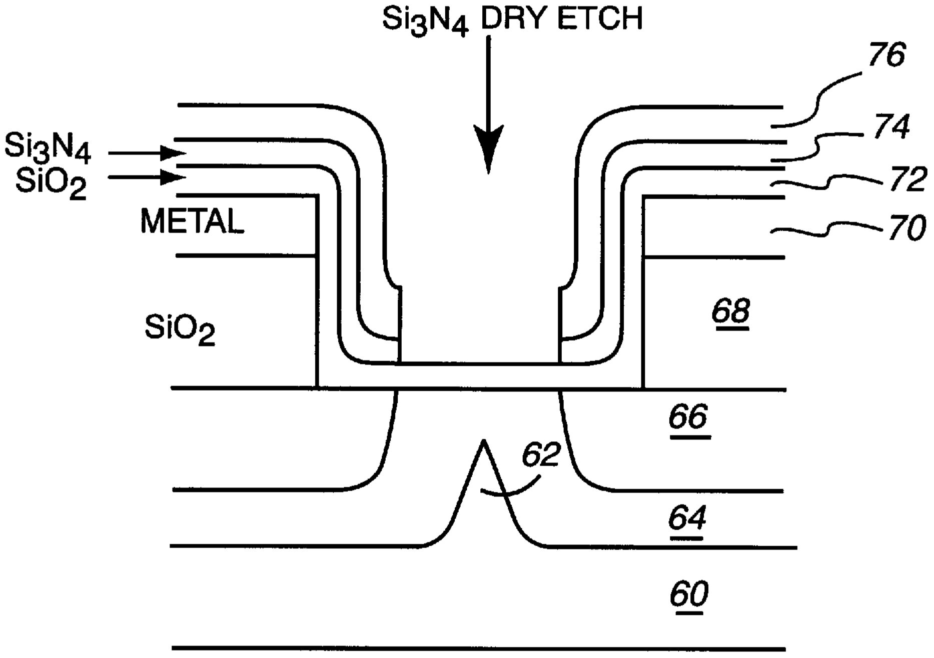
Figure 4C:
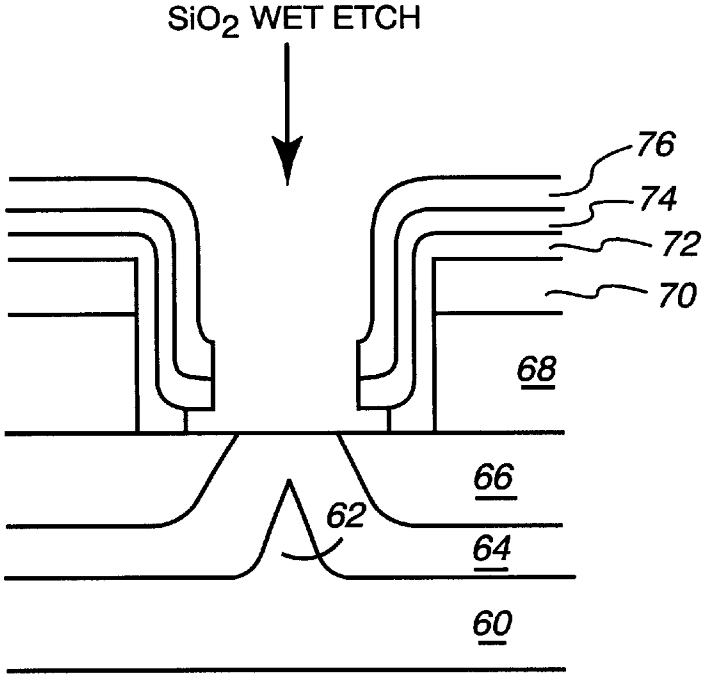
Figure 4D:
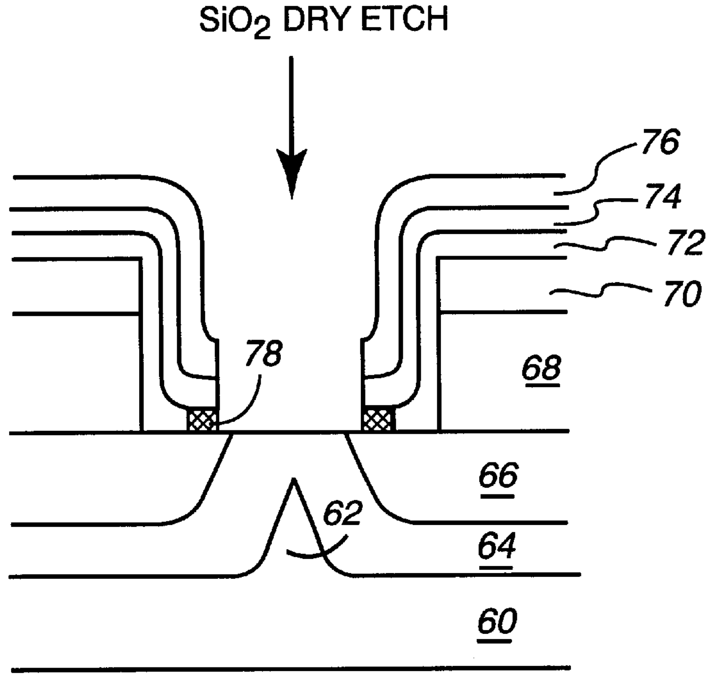
Figure 4E:
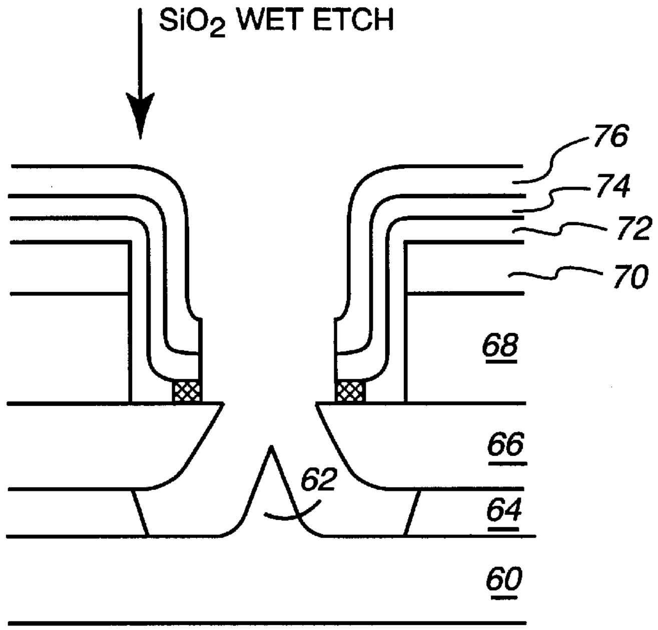
Figure 4F:
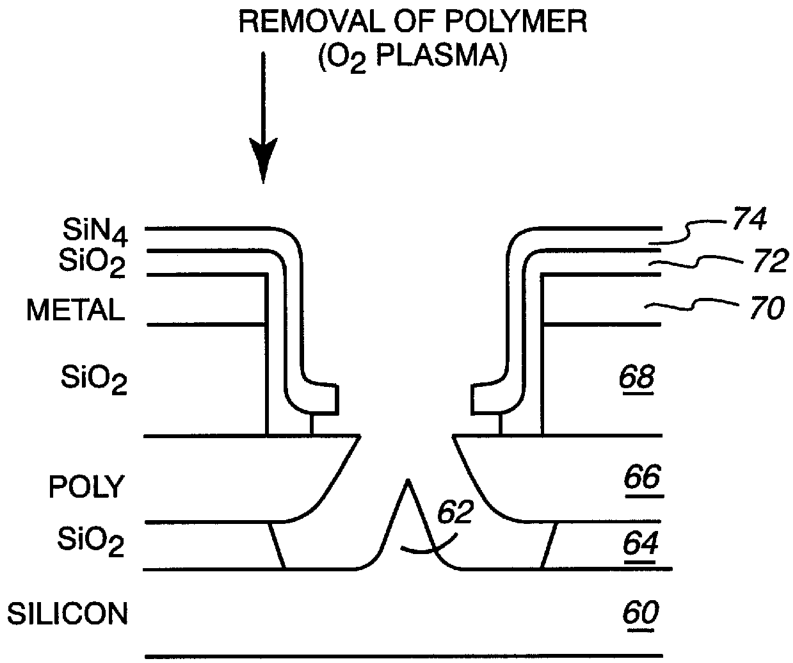
Figure 5A:
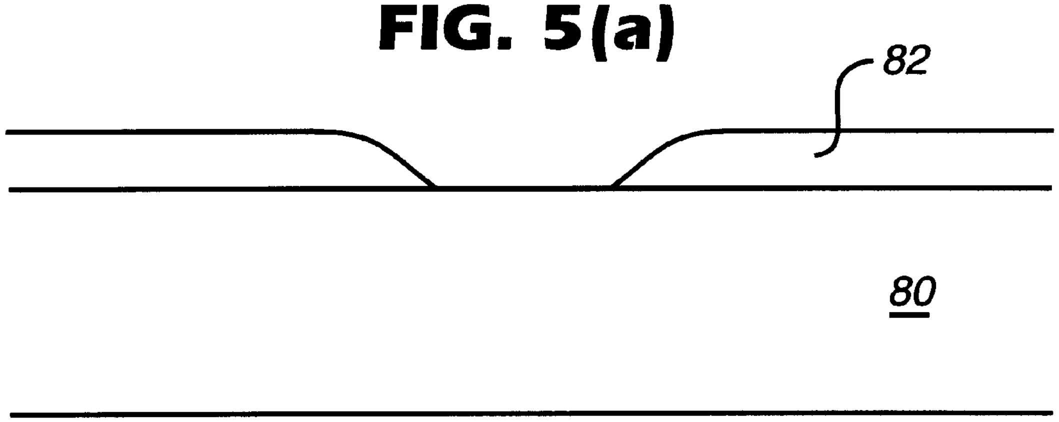
FIG. 5(*a*) is a cross-sectional schematic drawing of a single material work piece having a resist pattern formed thereon.
Figure 5B:
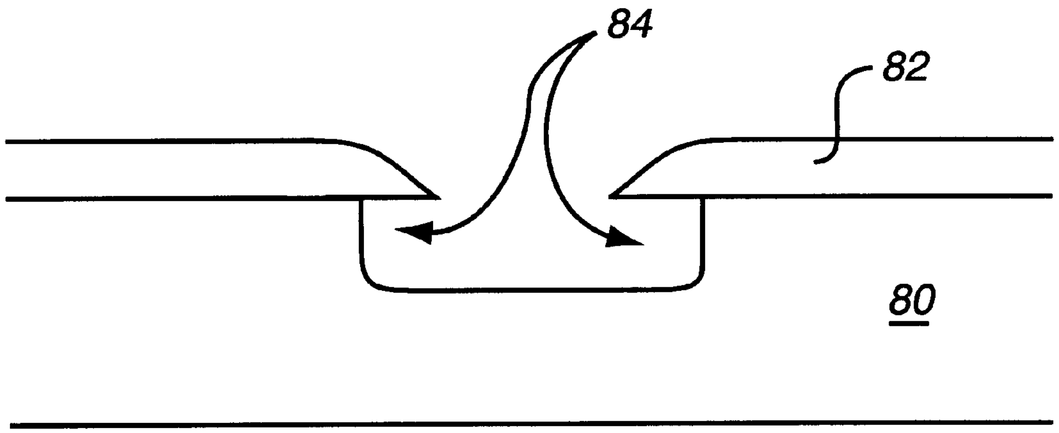
Figure 5C:
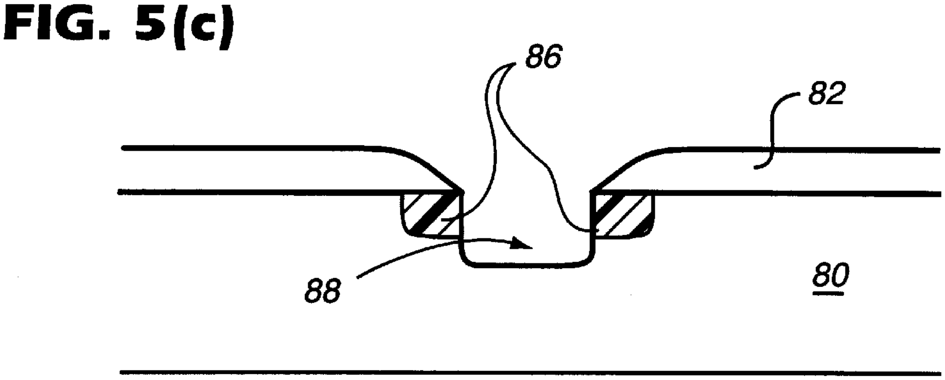
Figure 5D:
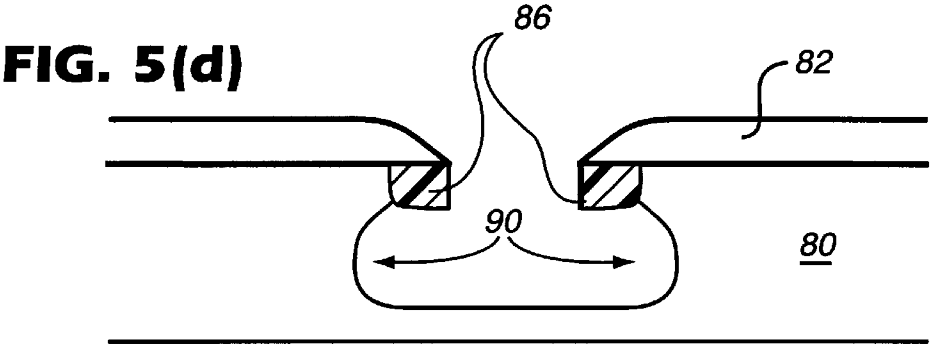
Figure 5E:
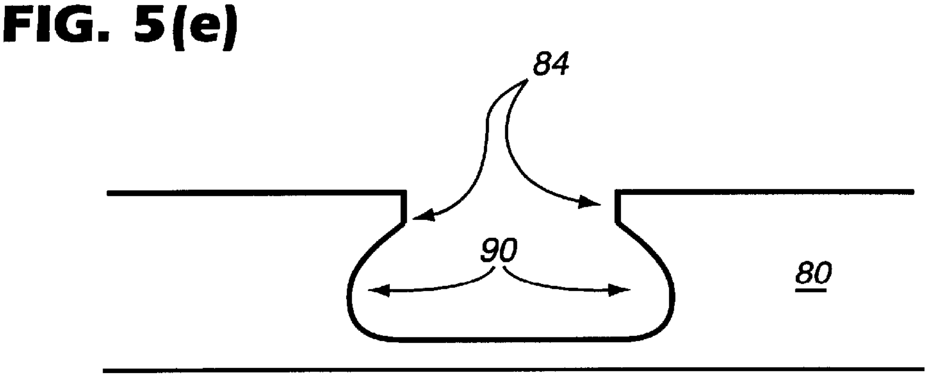

FIG. 3 is a cross-sectional schematic of a portion of a known flat panel field emission display. In particular, a single display segment 30 is depicted. Each display segment is capable of displaying a pixel of information or a portion of a pixel as, for example, one green dot of a red/green/blue full-color triad pixel. A field emission display base assembly 32 includes a patterned conductive material layer 34 provided on a base 36 such as a soda lime-glass substrate. The conductive material layer 34 may be formed, for example, from doped polycrystalline silicon and/or an appropriate conductive metal such as chromium. The conductive material layer 34 forms base electrodes and conductors for the field emission device.

Conical micro-cathode field emitter tips 38 are constructed over the base 36 at the field emission cathode site.

A base electrode resistive layer (not shown in FIG. 1) may be provided between the conductive material layer 34 and the field emitter tips 38. The resistive layer may be formed, for example, from silicon that has been doped to provide an appropriate degree of resistance. A low potential anode gate structure or conductive grid 40 formed, for example, of doped polycrystalline silicon is arranged adjacent the field emitters 38. An insulating layer 42 separates the grid 40 from the base electrode conductive material layer 34. The insulating layer 42 may be formed, for example, from silicon dioxide.

Proper functioning of the emitter tips requires operation in a vacuum. Thus, a plurality of columnar supports or spacers 44 is provided over the base assembly 32 to support a display screen 46 against atmospheric pressure. The spacers 44 may be formed in a number of conventional ways. Appropriate techniques for forming the spacers 44 are disclosed, for example, in U.S. Pat. No. 5,205,770 issued Apr. 27, 1993 to Lowrey et al., U.S. Pat. No. 5,232,549 issued Aug. 3, 1993 to Cathey at al., U.S. Pat. No. 5,484,314 issued Jan. 16, 1996 to Farnworth, and U.S. Pat. No. 5,486,126 issued Jan. 23, 1996.

In operation, the display screen 46 acts as an anode so that field emissions from the emitter tips 38, represented by arrows 48, strike phosphor coating 50 on the screen 46. The field emissions excite the phosphor coatings 50 to generate light. A field emission is produced from an emitter tip when a voltage controller 52 establishes a voltage differential between the emitter tip and the anode structures.

Various techniques are known in the art for selectively activating a display segment. For example, the grid 40 and screen 46 could be held at a constant voltage potential and emitter tips selectively switched through column and row signals. In such an arrangement, the patterned conductive material 34 which forms the cathode base electrodes is arranged as a matrix that is addressable through column and row control signals. Alternatively, the base electrode conductors could be arranged in rows and the grid 40 arranged in columns perpendicular to the rows of cathode base electrodes. Row control address signals to the cathode base electrodes and column control address signals to the grid column segments selectably activate display segments. Finally, the cathodes could be held at a constant voltage potential and a switched anode scheme utilized for the display screen 46.

FIG. 3 is intended to provide a general background overview of the structure and operation of an FED. It is not meant to provide a detailed illustrated of each feature of an actual FED structure. However, it is useful in understanding the application of the present invention described in connection with FIGS. 4(*a*) through 4(*f*).

FIG. 4(*a*) illustrates a portion of a base structure that may be used to manufacture a flat panel FED in accordance with another aspect of the present invention. This structure may be produced using standard patterning techniques well known in the art. Briefly, the structure includes a silicon substrate 60 having a conical cathode emitter tip 62 formed thereon. An insulating silicon dioxide layer 64 is provided over the substrate 60. Additional layers formed over the silicon dioxide layer 64 include a conductive doped polycrystalline silicon ("polysilicon") layer 66, an insulating silicon dioxide layer 68, a metal layer 70, an additional silicon dioxide insulating layer 72, and a passivating silicon nitride ($Si_3N_4$) layer 74. A resist pattern 76 may be formed over the silicon nitride layer 74 using a standard lithographic technique.

Turning now to FIG. 4(*b*), the silicon nitride layer 74 is selectively etched by a dry etch process. As a result, an opening is established in the silicon nitride layer 74 over the cathode emitter tip 62. Because the particular dry etchant utilized is chosen to etch the nitride layer 74, there is no significant etching of the underlying silicon dioxide layer 72.

A first wet etch of the silicon dioxide layer 72 is performed next, as shown in FIG. 4(*c*). The wet etch creates an undercut or recession in the silicon dioxide layer 72 under the end portions of the underlying silicon nitride layer 74. Although the wet etch may remove a portion of the silicon dioxide layer 64, it is not necessary that this layer be completely etched at this point.

With reference to FIG. 4(*d*), the first silicon dioxide wet etch is followed by a dry etch of the silicon dioxide layer 64. The dry etch causes a polymer film 78 to build up in the undercut or recessed portion of the silicon dioxide layer 72. The polymer film 78 protects the silicon dioxide layer 72 during later wet etching. Because the silicon dioxide layer 64 will be subsequently subjected to a further wet etch, it is not necessary that the dry etch expose the cathode emitter tip 62. Instead, the operating parameters of the dry etch should be selected to optimize creation of the polymer film 78.

The silicon dioxide dry etch is then followed by a second silicon dioxide wet etch. The second silicon dioxide wet etch removes the portion of the silicon dioxide layer 64 remaining around the cathode emitter tip 62 and establishes a desired degree of undercut or recession in the silicon dioxide layer 64, as illustrated in FIG. 4(*e*). Upon completion of the second wet etch, the resist material 20 is stripped and the polymer film 78 is removed using, for example, an oxygen plasma. The resultant structure is shown in FIG. 4(*f*).

In summary, the base structure of FIG. 4(*a*) may be processed in accordance with one aspect of the present invention to provide a resultant structure useful in manufacturing an FED. Specifically, in the example process discussed above, the base structure is subjected to a dry etch of the silicon nitride layer 74 to expose the underlying silicon dioxide layer 72. A wet etch of the silicon dioxide layer 72 establishes an undercut that is then covered by a protective polymer film 78 during a polymerizing dry etch of the silicon dioxide. A second wet etch of the silicon dioxide is then performed to remove a portion of the silicon dioxide layer 64 and expose the emitter tip 62. Finally, the resist material 20 is stripped and the polymer film 78 is removed to obtain the resultant structure shown in FIG. 4(*f*). This resultant structure may then be subjected to further manufacturing steps to add spacers (see spacers 44 of FIG. 3) and a display screen.

The present invention is not limited to operation on multi-layer work pieces. Indeed, the principles of the present invention may be utilized in a single layer material to create desired custom cross-sectional profiles. Referring to FIG. 5(*a*), a material layer 80 of, for example, silicon dioxide is provided with a resist pattern 82.

A first wet etch of the silicon dioxide material 80 is performed to produce the undercut portions 84 shown in FIG. 5(*b*). A dry etch then generates a protective polymer film 86 in the undercut portion and removes additional silicon dioxide from the area 88 of FIG. 5(*c*). Next, a second wet etch produces the structure shown in FIG. 5(*d*), including further undercut portions 90. Following stripping of the resist material 82 and removal of the polymer film 86, the resultant structure of FIG. 5(*e*) is obtained.

One possible use of the structure illustrated in FIG. 5(*e*) is in connection with micromachines. In particular, the enlarged area defined by the undercut portions 90 can provide space for rotating members of a micromachine and the opening established by the smaller undercut portion 84 can permit a drive shaft or the like to extend beyond the top surface of the silicon dioxide layer 80.

Figure 6:
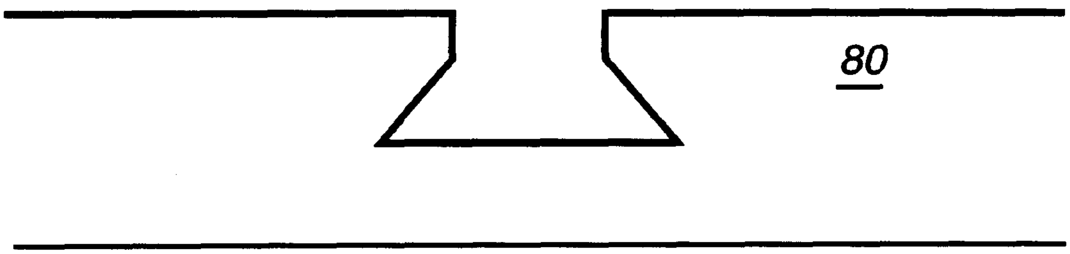
FIG. 6 is a cross-sectional schematic drawing illustrating another undercut profile that may be produced in a single layer material utilizing a process similar to that illustrated in FIGS. 5(*a*) through 5(*e*)

Shapes other than that illustrated in FIG. 5(*e*) are also possible. For example, certain etching processes are known to follow the lines of the crystal being etched. Such an etching process could be used to produce a profile such as is illustrated in FIG. 6.

Figure 7:
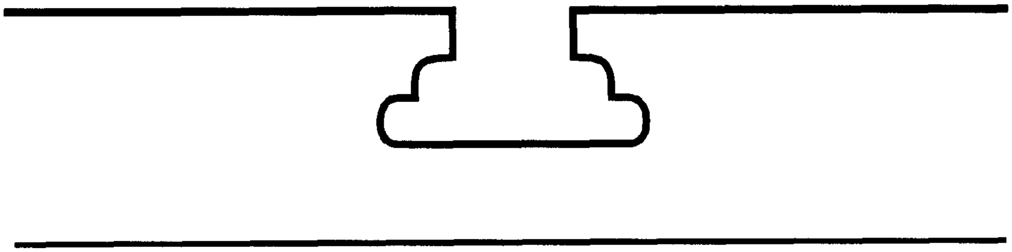
FIG. 7 is a cross-sectional schematic drawing illustrating another undercut profile that may be produced in a single layer material utilizing a process similar to that illustrated in FIGS. 5(*a*) through 5(*e*).

It is also possible to repeat the process described in connection with FIGS. 5(*a*) through 5(*e*) to produce undercut profiles having a number of "steps," as shown for example in FIG. 7. Specifically, the profile of FIG. 7 could be produced by performing an additional dry etch following the second wet etch (FIG. 5(*d*)). A third wet etch would follow the additional dry etch to produce a profile such as the profile shown in FIG. 7.

The structures and profiles produced in the manner described above are examples of many that may be produced in accordance with the features and principles of the present invention. Thus, these structures and profiles should be viewed as exemplary rather than as limiting. Those of ordinary skill in the art will recognize a number of additional arrangements that may be produced in accordance with the features of the present invention.

Although the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of establishing different degrees of undercutting of a layer of a semiconductor device, comprising:

undercutting said layer of said semiconductor device a first time;

depositing a polymer along an undercut portion of said layer; and undercutting said layer a second time.

2. A simplified etch process capable of generating selected undercut profiles in a work piece, comprising the steps of:

performing a first wet etch of portions of said work piece to create a first undercut in said work piece;

forming a polymer film over side surfaces of said first undercut to inhibit further etching of said first undercut during subsequent etching operations; and performing a second wet etch of portions of said work piece to create a second undercut in said work piece.

3. The simplified etch process of claim 2, wherein said polymer film is formed by a polymerizing dry etch.

4. The simplified etch process of claim 2, including the preliminary step of applying a resist pattern over said work piece, and wherein said portions of the work piece on which said first wet etch and said second wet etch are performed are established by apertures in said resist pattern.

5. The simplified etch process of claim 4, including the further steps of stripping said resist pattern and removing said polymer film subsequent to said second wet etch.

6. A method for producing an undercut profile in a work piece comprising the steps of:

forming a resist pattern on a top surface of said work piece, said resist pattern including apertures which expose portions of said work piece at which an undercut profile is to be created;

performing a first etch on said work piece, said first etch operating on the portions of said work piece exposed by said resist pattern to remove material from said work piece and create a selected undercut in said work piece;

performing a second etch on said work piece; said second etch operating on said work piece to remove material from said work piece under said resist pattern apertures, said second etch further producing a polymer film which at least partially fills the selected undercut created by said first etch;

performing a third etch on said work piece, said third etch operating on exposed portions of said work piece to remove material from said work piece and create an additional selected undercut in said work piece;

stripping said resist pattern; and removing said polymer film.

7. The method of claim 6, wherein said first etch and said third etch are each a wet etch process.

8. The method of claim 7, wherein said second etch is a polymerizing dry etch process.

9. The method of claim 6, wherein said second etch is a polymerizing dry etch process.

10. The method of claim 6, wherein said work piece is a single layer of material.

11. The method of claim 6, wherein said work piece includes a plurality of material layers wherein at least two of the material layers are formed of the same material.

12. A method used in the manufacture of a flat panel field emission display, comprising:

forming a resist pattern over a field emission display base structure, said base structure including a plurality of material layers arranged on a substrate, wherein at least a first material layer and a second material layer are formed of the same material, said resist pattern having a plurality of apertures which define portions of said base structure which are to be etched;

etching said first material layer at the portions of said base structure defined by said apertures with an etching process which creates an undercut in said first material layer;

etching the portions of said base structure defined by said apertures with a polymerizing etch process which forms a polymer film at the undercut in said first material layer;

etching said second material layer at the portions of said base structure defined by said apertures with an etching process which creates an undercut in said second material layer;

removing said polymer film; and removing said resist pattern.

13. The method of claim 12, wherein the step of etching said first material layer is a wet etch process.

14. The method of claim 13, wherein said first material layer and said second material layer are insulation layers formed of silicon dioxide, and wherein said step of etching the first material layer and said step of etching the second material layer are each wet etch processes utilizing hydrogen fluoride.

15. The method of claim 12, wherein said base structure includes a top layer of silicon nitride, and wherein a dry etch of said silicon nitride layer is performed at the portions of the base structure defined by said apertures prior to etching said first layer.

* * * * *